DEVICE FOR AMPLITUDE-MODULATING A HIGH FREQUENCY CARRIER WAVE

Filed Oct. 12, 1964 3 Sheets-Sheet 1

INVENTOR
Philipp Besslich
BY Spencer & Kaye
ATTORNEYS

INVENTOR
Philipp Besslich
BY Spencer & Kaye
ATTORNEYS

Jan. 9, 1968 P. BESSLICH 3,363,199

DEVICE FOR AMPLITUDE-MODULATING A HIGH FREQUENCY CARRIER WAVE

Filed Oct. 12, 1964 3 Sheets-Sheet 3

INVENTOR
Philipp Besslich

BY Spencer & Kaye
ATTORNEYS

United States Patent Office 3,363,199
Patented Jan. 9, 1968

3,363,199

DEVICE FOR AMPLITUDE-MODULATING A HIGH FREQUENCY CARRIER WAVE

Philipp Besslich, Bremen, Germany, assignor to Telefunken Patentverwertungs-G.m.b.H., Ulm (Danube), Germany Filed Oct. 12, 1964, Ser. No. 402,987
Claims priority, application Germany, Oct. 10, 1963, T 24,869
10 Claims. (Cl. 332—10)

ABSTRACT OF THE DISCLOSURE

A device for amplitude-modulating a high frequency carrier wave using power switching circuits to minimize energy losses. The device generates a sinusoidal voltage having a frequency equal to the desired carrier frequency, rectifies this voltage and modulates its envelope with the incremental signal of the input modulating voltage and produces a pulse width modulated rectangular signal from this modulated rectified voltage having its fundamental component equal to the carrier wave frequency. The rectangular wave is then amplified, using power switching circuits, and the modulated carrier wave filtered therefrom.

The present invention relates to a circuit for producing an amplitude-modulated, high frequency, high-power output signal in an efficient manner. More specifically, the invention contemplates pulse-width modulating a square wave in a manner to be explained, amplifying the modulated square wave, and filtering the desired component from the amplified wave. By this means, a power output stage of high efficiency is provided.

It is well known that in order to achieve a high degree of efficiency in a high-frequency transmitter output stage, the active amplifier elements should be modulated with a wave form approaching a square wave. The amplifier elements of the transmitter output stage then operate as switches. In this mode of operation, as compared with other modes, power loss is a minimum.

The best known and most conventional method of ampiltude-modulating a high-frequency, high power signal is that of anode-modulating a high-frequency transmitter output stage by means of a push-pull (class B) audio-frequency amplifier, the output of which corresponds to that of the high-frequency amplifier.

This modulating circuit is described in detail, along with other known modulating circuits, in the book "Taschenbuch der Hochfrequenztechnik" (Handbook of High-Frequency Engineering) by Meinke-Gundlach, Section U. By means of this so-called anode-B-modulating circuit, an efficiency of approximately 65% is obtained, largely due to the relatively low efficiency of the audio-frequency amplifier. In order to improve the efficiency of the audio-frequency amplifier, it has been proposed that its output stage be modulated not with the modulating waveform, but with a pulse train wherein the pulse width is proportional to the instantaneous value of the modulating voltage. The frequency of the pulse train should be substantially higher than the highest frequency component of the modulating waveform. The modulating waveform can be retrieved from the pulse-width modulated waveform after amplification. The advantage of this circuit lies in that the low-frequency output stage can operate as a switch i.e., class S operation, which is a highly efficient mode of operation.

According to the present invention, the high-frequency amplifier stage itself is directly modulated by a specially generated waveform; thus, the low-frequency amplifier formerly necessary may be dispensed with.

It is therefore an object of the present invention to provide a highly efficient device for producing an amplitude-modulated, high frequency waveform at a high power level.

It is a further object of the present invention to provide a high frequency, high-power amplitude-modulated waveform by generating a rectangular waveform wherein the relative pulse width is proportional to the angle whose sine is ½ (1+the normalized instantaneous modulating signal amplitude).

Additional objects and advantages of the present invention will become apparent upon consideration of the following description when taken in conjunction with the accompanying drawings in which.

According to the invention, means are provided for producing a train of rectangular pulses having a pulse frequency equal to the desired carrier frequency. The amplitude of the fundamental frequency component of the pulse train varies, since the pulse width varies in proportion to the instantaneous amplitude of a modulating waveform. A power amplifier is provided to amplify the pulse train and the modulating waveform is retrieved by filtering out the fundamental of the amplifier output waveform.

The pulse width modulation is carried out according to the relationship:

$$\varphi = 2 \arcsin \frac{1+a}{2}$$

where $\varphi$ is the pulse width relative to the period of the waveform divided by $2\pi$, and $a$ is the instantaneous amplitude of the modulating waveform, divided by the value at full modulation.

Figure 1:
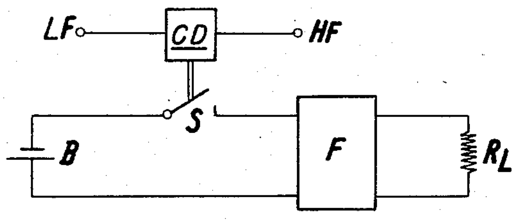
FIGURE 1 is a block diagram showing schematically a device designed according to the invention.

Referring more specifically to the drawings, FIGURE 1 illustrates the principle of the invention, in schematic form. The power delivered by a direct current source B is converted into high-frequency power by means of a switch S and a filter F and is then available at a load resistor $R_L$. Switch S, which may be a switching transistor, for example, or an electron tube, is operated by a control device CD. This control device is fed, at one of its inputs LF, with a modulating waveform and, at the other input HF, with a high-frequency carrier signal. The control device closes switch S at a constant frequency (group frequency) which corresponds to the frequency of the high-frequency signal fed to the input HF of the control device. The duration of closing of the switch is made dependent upon the instantaneous amplitude of the modulating waveform fed to input LF of the control device. The dependency should be such that the relationship set forth above exists between the relative closed time of the switch (also called forward flow angle) and the relative instantaneous amplitude $a$ of the modulating waveform that is:

$$\sin\frac{\varphi}{2}=\frac{1+a}{2}$$

or $$\varphi=2\ \text{arc}\sin\frac{1+a}{2}$$

This condition may be derived as follows:

A sequence of bipolar rectangular pulses of constant relativce pulse length $\varphi(0\leqslant\varphi\leqslant\pi)$, constant series frequency $\Omega/2\pi$ and constant pulse amplitude I can be represented by a Fourier series of the following form:

(1) $f(\Omega t)=4I/\pi\ (\sin\varphi/2\sin\Omega t-1/3\sin 3\varphi/2\sin 3\Omega t+\ldots)$ (The series for a unipolar sequence of rectangular pulses differs from Equation I only in that it includes a constant representative of a D.C. level, and plus and minus signs would be reversed.)

The Fourier series shows that the rectangular waveform is composed of sinusoids at frequencies of $\Omega$ and multiples thereof. It will be noted that the amplitude of the fundamental, i.e. the component at frequency $\Omega$, is proportional to the sine of half the forward flow angle $\varphi$. In order to amplitude modulate the fundamental a certain relationship must exist between the forward flow angle $\varphi$ and the amplitude of the modulating waveform.

The instantaneous value of the relative amplitude (instantaneous relative amplitude) of the modulating waveform, i.e. the ratio of its instantaneous value to the largest value which it is capable of assuming (at "full modulation") will be designated $a$. The magnitude $a$ which is a function of time $t$, thus has a range of $\pm 1$, depending upon whether the modulating voltage is positive or negative with respect to a reference potential.

From these limiting conditions, the relationship between $\varphi$ and $a$ may be stated. The fundamental of the pulse width modulated pulse train, which is the modulated high-frequency carrier signal, can be described in the following manner:

(2) $f(t)=A(1+a(t))\sin\Omega t$ wherein A represents the mean carrier amplitude, i.e., the amplitude of the unmodulated high-frequency wave. Comparing Equation 2 with the above-described Fourier series (1) for the rectangular pulse train, and in particular with the member of the series representing the fundamental, it is found that the condition must exist:

$$\sin\frac{\varphi}{2}\sim(1+a)$$

To find the limits of $\varphi$, we note that the fundamental of the rectangular pulse train has a maximum amplitude for $\varphi=\pi$ ($\sin\varphi/2=1$) and a minimum amplitude for $$\varphi=0\ (\sin\varphi/2=0)$$

Figure 2:
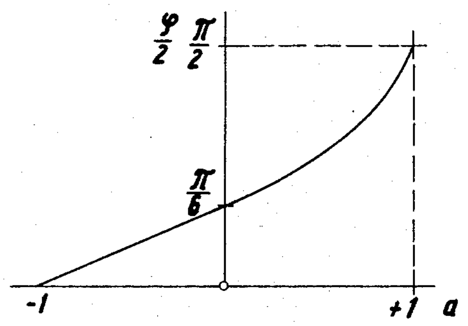
FIGURES 2 and 3 are graphs showing the relationship between the instantaneous amplitude of the modulating waveform and the pulse width of the resultant rectangular pulses.

Thus $\varphi$ varies between the value 0 and $\pi$, while $a$ assumes values between $-1$ and $+1$. These limit conditions are satisfied by the equation:

(3) $\sin\frac{\varphi}{2}=\frac{1+a}{2}$ or $\varphi=2\ \text{arc}\sin\frac{1+a}{2}$ This equation gives the relationship between $\varphi$ and $a$, i.e., between forward flow angle and the modulating waveform. This relationship, which is shown graphically in FIGURE 2, is embodied in the circuits described with respect to FIGURES 3 through 7.

Figure 3:
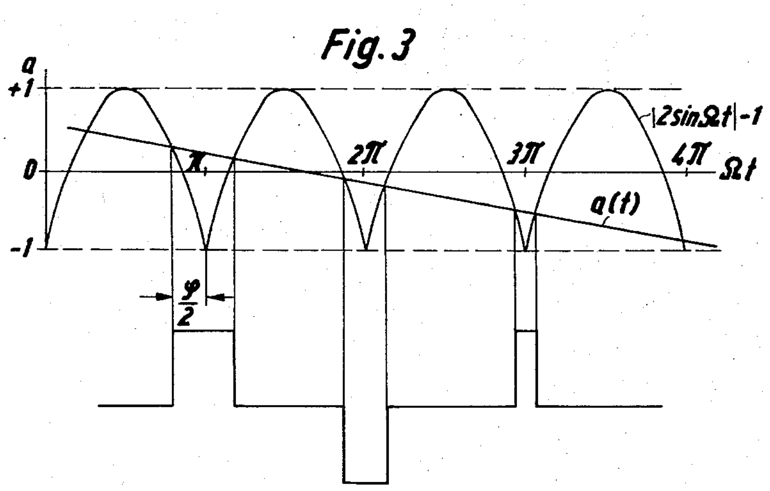

FIGURE 3 indicates graphically how the desired waveform may be obtained. A high-frequency sinusoidal waveform of frequency $\Omega$ is full-wave rectified. Its amplitude is assumed to be twice that of the maximum amplitude of the modulating waveform. If this rectified high-frequency wave is superposed on the modulating signal $a(t)$ in the manner shown in FIGURE 3, the forward flow angles $\varphi$ are obtained from the intersections of the two curves for every value $a$ of the modulating waveform in correspondence with Equation 3. FIGURE 3 also shows how the pulse width of the rectangular wave varies with decreasing modulating voltage. The representation is strongly exaggerated, since normally the modulating oscillation changes much more slowly, compared to the high-frequency signal. A circuit having this operating plot would have to be constructed in such a manner that the rectified high-frequency wave is fed to a trigger or threshold circuit, the trigger threshold of which is variable in proportion to the modulating voltage. The trigger circuit delivers an output voltage as long as the amplitude of the sine wave lies below the threshold; thus, it yields rectangular pulses whose width is dependent in the required manner upon the height of the threshold, i.e. upon the amplitude of the modulating oscillation. However, such a circuit is difficult to construct. It is much simpler to build the circuit shown in FIGURE 4, the operating diagram of which is shown in FIGURE 5. The modulating voltage, in example of which is represented by the curve $a(t)$ in FIGURE 5 is fed, via input LF, to an adder network AN1, in which a D.C. voltage is added to it. This D.C voltage should be three times the value of the maximum amplitude of the modulating signal. Again making $a$ the instantaneous relative amplitude of the modulating signal ($-1\leqq a\leqq+1$), the value of the D.C. voltage becomes 3. The output voltage of the adder network AN1 is thus curve $(a+3)$ in FIGURE 5. A rectified sine wave, produced by the full-wave rectifier G1 from the high-frequency voltage at frequency $\Omega$ which is applied to input HF is subsctracted from this output voltage in a further adder network AN2. The amplitude of the fully rectified high-frequency sine wave is set to the value 2.

The output voltage of the adder network is represented by the curve $(a+3)-|2\sin\Omega t|$. This voltage is then applied to a flip-flop or trigger circuit K1, which has two outputs. This circuit has the property that, when the input voltage increases beyond a threshold value T which, in this case, is set at the value 2, one of the outputs delivers a constant output voltage until the input voltage again falls below the threshold value T. With the next subsequent increase in the input voltage, the other output delivers a constant output voltage, which similarly ceases when the input voltage falls below the threshold value T. The two outputs continue to alternately react to the input, in the same manner.

The rectangular pulses supplied by the two outputs of the flip-flop circuit K1 modulate the power amplifiers A1 and A2, the outputs of which are connected in a push-pull circuit. The resultant output voltage has the rectangular shape indicated in FIGURE 5, the positive pulses coming, for example, from amplifier A1 and the negative pulses from amplifier A2. A filter F1 separates out the fundamental of this rectangular wave so that an amplitude-modulated sine wave is available at the output O. Because of the way in which the amplifier elements are modulated, they are operated only in the fully conducting and in the blocked states, so that the efficiency of the power amplifier is very high.

Figure 6:
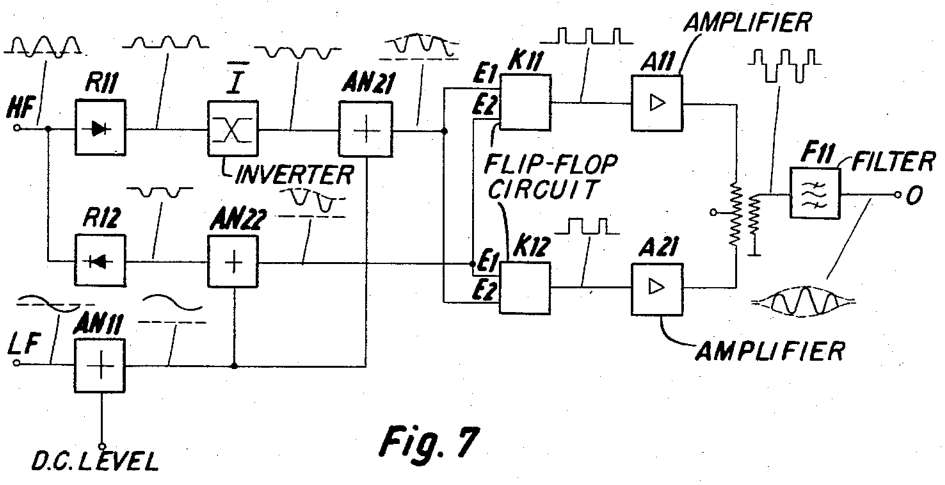

Under certain conditions, it is desirable to separate the positive and negative half-waves of the high frequency input sinusoid. This is particularly advantageous when operating in the single side band mode, in view of the fact that sudden phase shifts are possible. A circuit which separates the positive and negative half-waves is shown in FIGURE 6.

Figure 7:
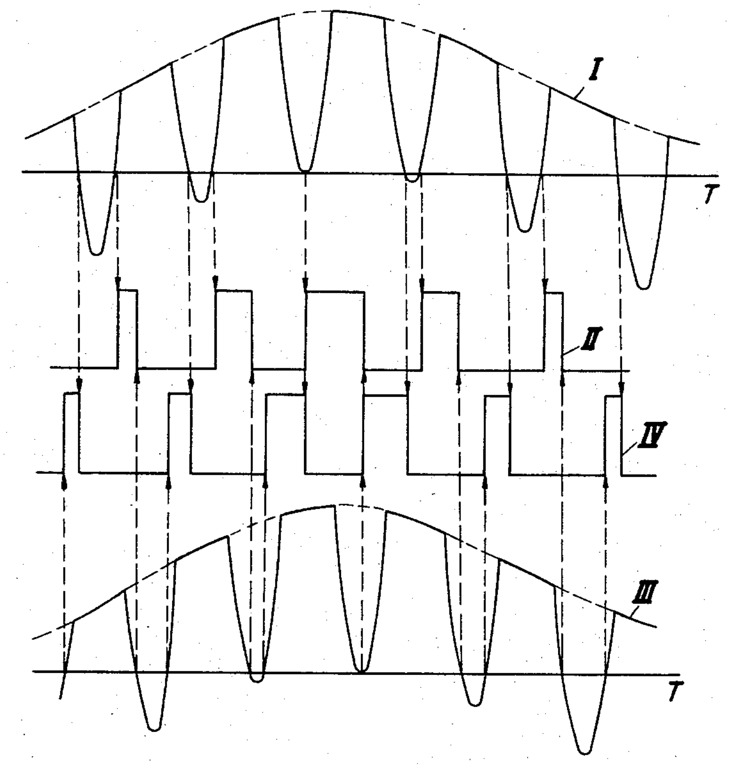

The operating diagram of this circuit is illustrated in FIGURE 7. The high-frequency voltage fed to the input HF of the circuit of FIGURE 6 is split into positive and negative half-waves by two half-wave rectifiers R11 and R12.

The negative half-waves supplied by rectifier R12 are added in adder network AN22 to the modulating signal, to which a D.C. voltage, having a value three times the maximum amplitude of said signal, has already been added in adder network AN11. The output voltage of the adder network AN22 is shown by curve III in FIGURE 7, which is identical to the voltage waveform shown in FIGURE 5, except that every second half-wave of the high-frequency sinusoid is missing. The positive half-waves have their polarity reversed in a polarity inverter Ī and are similarly added, in an adder network AN21, to the sum of the modulating signal and the D.C. level formed in AN11. These originally positive half waves thus become negative, and are 180° out of phase with those half waves which are supplied by rectifier G12. Curve I of FIGURE 7 shows the voltage at the output of the adder network AN21. The outputs of the two adder networks AN21 and AN22 are connected with the two inputs E1 and E2 of a flip-flop or trigger circuit K11; a second flip-flop circuit K12 having reversed inputs is connected in parallel with the first-mentioned flip-flop or trigger circuit. The fact that the inputs are reversed means that input E1 of flip-flop circuit K11 is connected with input E2 of the flip-flop circuit K12, and input E2 of flip-flop circuit K11 is connected with input E1 of flip-flop circuit K12. Both of the flip-flop circuits have the property that, when the input voltage of the first input E1 rises above a threshold value T, which is set in this case such that it corresponds to an amplitude value of 2, the output of the flip-flop circuit delivers an output voltage which continues until the input voltage of the second input E2 decreases below an identical threshold value T. The characteristics of the output voltages of these flip-flop circuits as functions of the input voltages are shown by curves II (output voltage of flip-flop circuit K11) and IV (output voltage of flip-flop circuit K12). As in the circuit of FIGURE 4, the output voltages of the flip-flop circuits are used for modulating the power amplifier, which includes amplifier stages A11 and A12, the outputs of which are connected in a push-pull circuit. A filter F11 picks out the fundamental of the resultant rectangular wave so that a modulated sine wave is available at output O.

The outputs of the power stages can be joined via a bridge circuit or a push-pull transformer. When using transistor amplifiers, the use of a pnp-npn transistor pair, the outputs of which are directly parallel-connected, will serve the same purpose.

Figure 4:
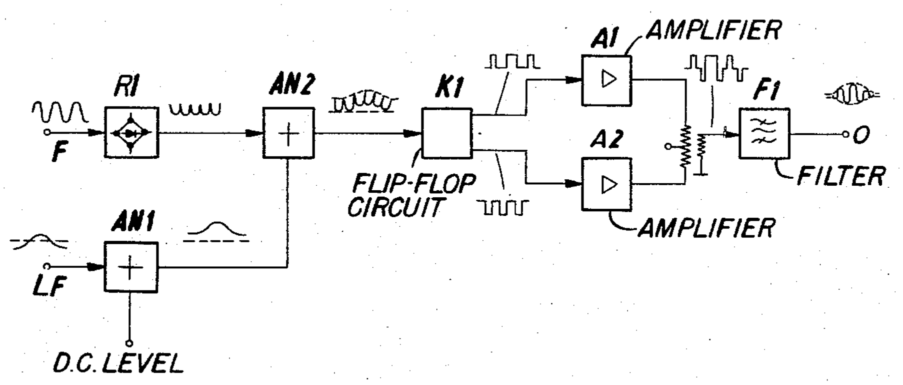
FIGURES 4 and 6 are block diagrams of various embodiments of the invention.
Figure 5:
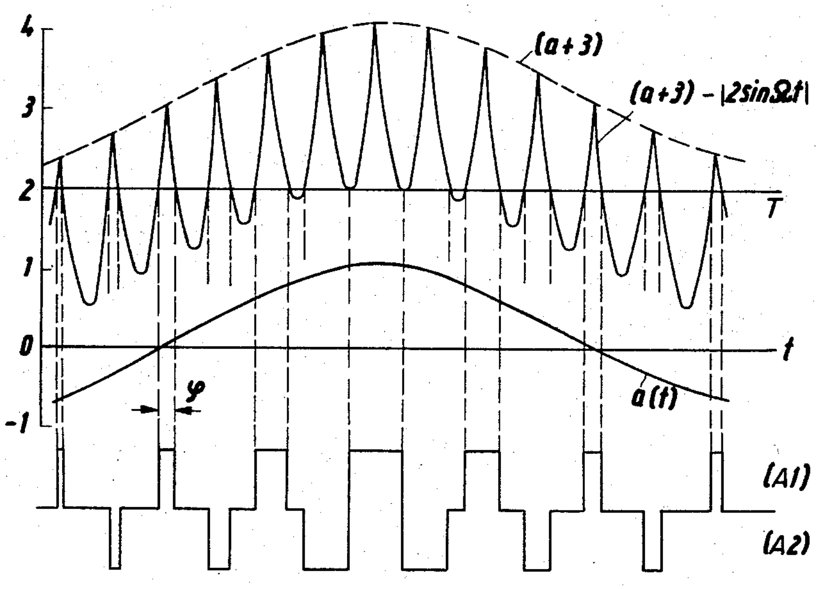
FIGURES 5 and 7 are graphs showing various waveforms which occur in the circuits of FIGURES 4 and 6, respectively.

In the circuits of FIGURES 4 and 6, the second power amplifier stages A2 and A21, respectively, can also be omitted without anything changing in the mode of operation of the circuits; the amplitude of the modulated high-frequency output signal will merely be halved.

In case a single side-band waveform is to be produced, the high-frequency sinusoid which produces the rectangular wave must be phase-modulated with the phase modulation component of the single-side band oscillation, while the envelope curve characteristic of the single side-band signal is fed to the LF input.

It will be understood that the above description of the present invention is susceptible to various modifications, changes, and adaptations, and the same are intended to be comprehended within the meaning and range of equivalents of the appended claims.

What is claimed is:

1. A device for producing an amplitude-modulated high-frequency high power signal, according to a modulated waveform, with a high degree of efficiency, said device comprising, in combination:

(a) first means for adding the modulating waveform to a D.C. voltage having a magnitude of three times the maximum amplitude of the modulating waveform;

(b) a source of sinusoidal voltage having a frequency equal to the desired carrier frequency;

(c) means for full-wave-rectifying said sinusoidal voltage; the output amplitude of said means being twice that of the maximum modulating voltage amplitude;

(d) means for subtracting the fully rectified sinusoidal voltage from the output of the first means;

(e) a flip-flop circuit having an input connected to the output of the subtracting means, and two outputs, said flip-flop circuit including (1) means for providing a threshold signal corresponding to a value of twice the maximum modulating waveform amplitude, (2) first means for generating an output voltage at a first of the outputs from the time the input voltage rises above the threshold value until the time the input level first falls below the threshold value, and (3) second means for providing an output voltage at the other output from the time when the input voltage next rises above the threshold value until the time that it falls below said value, the two outputs continuing to respond alternately to the input;

(f) amplifying means connected to at least one output of said flip-flop circuit operative in the switching mode for amplifying said output voltage; and (g) filtering means in the output of said amplifier for filtering out said fundamental, so that the fundamental is available at the output.

2. A circuit as defined in claim 1, wherein said amplifying means includes a first power amplifier connected to one output of the flip-flop circuit, the other output remaining unused.

3. A device as defined in claim 2, wherein said amplifying means includes a second power amplifier connected to the other output of the flip-flop circuit, and further including means connecting the first and second power amplifier outputs together in a push-pull circuit.

4. A device for producing an amplitude-modulated high-frequency high power signal, according to a modulated waveform, with a high degree of efficiency, said device comprising, in combination:

(a) first means for adding the modulating waveform to a D.C. voltage having a magnitude of three times the maximum amplitude of the modulating waveform;

(b) a source of sinusoidal voltage having a frequency equal to the desired carrier frequency;

(c) means for full-wave-rectifying said sinusoidal voltage, the output amplitude of said means being twice that of the maximum modulating voltage amplitude;

(d) means for subtracting the fully rectified sinusoidal voltage from the output of the first means;

(e) a flip-flop circuit having an input connected to the output of the subtracting means, and two outputs, said flip-flop circuit including (1) means for providing a threshold signal corresponding to a value of twice the maximum modulating waveform amplitude, (2) means responsive to every second transition of the input voltage from below to above the threshold value for actuating at least one of said outputs to an output voltage, and (3) means responsive to each transition of the input voltage from above to below the threshold value when said at least one of said outputs is actuated for deactuating the same;

(f) amplifying means connected to said at least one of said outputs of said flip-flop circuit operative in the switching mode for amplifying said output voltage; and (g) filtering means in the output of said amplifier for filtering out said fundamental, so that the fundamental is available at the output.

5. A device for producing an amplitude-modulated high-frequency high power signal, according to a modulated waveform, with a high degree of efficiency, said device comprising, in combination:

(a) first adding means for adding the modulating waveform to a D.C. voltage having a value of three times the maximum amplitude of the modulating waveform;
(b) a source of sinusoidal voltage at a frequency equal to the desired carrier frequency;
(c) first half-wave rectifying means for passing only the positive half-cycles of said sinusoidal voltage, the amplitude of said positive half-cycles being twice the maximum amplitude of the modulating waveform;
(d) second half-wave rectifying means for passing the negative half-cycles of the sinusoidal waveform, said negative half-cycles having an amplitude twice that of the maximum amplitude of the modulating waveform;
(e) means for inverting the output of the first half-wave rectifying means;
(f) second adding means for adding the output of the second half-wave rectifying means to the output of the first adding means;
(g) third adding means for adding the output of the inverting means to the output of the first adding means;
(h) a first flip-flop circuit having first and second inputs, each connected to a different one of the second and third adder outputs, and an output, said flip-flop circuit including
  (1) means for providing a threshold voltage having a value corresponding to twice the maximum amplitude of the modulating waveform,
  (2) means responsive to an increase in the voltage at the first input above the voltage at said threshold source for actuating said output to provide a first output voltage, and
  (3) means responsive to a decrease in the voltage at the second input below said threshold value for deactuating the output,
(i) first amplifying means connected to said output of said first flip-flop circuit operative in the switching mode for amplifying said first output voltage; and
(j) filtering means in the output of said first amplifying means for filtering out said fundamental, so that the fundamental is available at the amplifier output.

6. A device as defined in claim 5, further including a second flip-flop circuit having two inputs and an output and the properties of the first flip-flop circuit, the first and second inputs of the second flip-flop circuit being connected, respectively, to the second and first inputs of the first flip-flip circuit, second amplifying means connected to the output of said second flip-flop circuit operative in the switching mode for amplifying a second output voltage produced at the output of said second flip-flop circuit, means connecting the outputs of said first and said second amplifying means together in a push-pull circuit, said filtering means being in the output of said push-pull circuit.

7. A device for generating a rectangular pulse width modulated waveform comprising, in combination:

(a) first means for adding the modulating waveform to a D.C. voltage having a magnitude of three times the maximum amplitude of the modulating waveform;
(b) a source of sinusoidal voltage having a frequency equal to the desired carrier frequency;
(c) means for full-wave-rectifying said sinusoidal voltage; the output amplitude of said means being twice that of the maximum modulating voltage amplitude;
(d) means for subtracting the fully rectified sinusoidal voltage from the output of the first means;
(e) a flip-flop circuit having an input connected to the output of the subtracting means, and two outputs, said flip-flop circuit including
  (1) means for providing a threshold signal corresponding to a value of twice the maximum modulating waveform amplitude,
  (2) first means for generating an output voltage at a first of the outputs from the time the input voltage rises above the threshold value until the time the input level first falls below the threshold value, and
  (3) second means for providing an output voltage at the other output from the time when the input voltage next rises above the threshold value until the time that it falls below said value, the two outputs continuing to respond alternately to the input.

8. A device for generating a rectangular pulse width modulated waveform comprising, in combination:

(a) first means for adding the modulating waveform to a D.C. voltage having a magnitude of three times the maximum amplitude of the modulating waveform;
(b) a source of sinusoidal voltage having a frequency equal to the desired carrier frequency;
(c) means for full-wave-rectifying said sinusoidal voltage, the output amplitude of said means being twice that of the maximum modulating voltage amplitude;
(d) means for subtracting the fully rectified sinusoidal voltage from the output of the first means;
(e) a flip-flop circuit having an input connected to the output of the subtracting means, and two outputs, said flip-flop circuit including
  (1) means for providing a threshold signal corresponding to a value of twice the maximum modulating waveform amplitude,
  (2) means responsive to every second transition of the input voltage from below to above the threshold value for actuating at least one of said outputs to an output voltage, and
  (3) means responsive to each transition of the input voltage from above to below the threshold value when said at least one of said outputs is actuated for deactuating the same.

9. A device for generating a rectangular pulse width modulated waveform comprising, in combination:

(a) first adding means for adding the modulating waveform to a D.C. voltage having a value of three times the maximum amplitude of the modulating waveform;
(b) a source of sinusoidal voltage at a frequency equal to the desired carrier frequency;
(c) first half-wave rectifying means for passing only the positive half-cycles of said sinusoidal voltage, the amplitude of said positive half-cycles being twice the maximum amplitude of the modulating waveform;
(d) second half-wave rectifying means for passing the negative half-cycles of the sinusoidal waveform, said negative half-cycles having an amplitude twice that of the maximum amplitude of the modulating waveform;
(e) means for inverting the output of the first half-wave rectifying means;
(f) second adding means for adding the output of the second half-wave rectifying means to the output of the first adding means;
(g) third adding means for adding the output of the inverting means to the output of the first adding means;
(h) a first flip-flop circuit having first and second inputs, each connected to a different one of the second and third adder outputs, and an output, said flip-flop circuit including
(1) means for providing a threshold voltage having a value corresponding to twice the maximum amplitude of the modulating waveform, (2) means responsive to an increase in the voltage at the first input above the voltage at said threshold source for actuating said output to provide a first output voltage, and (3) means responsive to a decrease in the voltage at the second input below said threshold value for deactuating the output.

10. A device as defined in claim 9, further including a second flip-flop circuit having two inputs and an output and the properties of said first flip-flop circuit, the first and second inputs of said second flip-flop being connected, respectively, to the second and first inputs of said first flip-flop circuit.

References Cited

UNITED STATES PATENTS

| | | | |
|---|---|---|---|
| 3,068,421 | 12/1962 | Duerdoth | 332—9 X |
| 3,072,854 | 1/1963 | Case | 332—9 |
| 3,225,303 | 12/1965 | Hauber | 332—9 X |

ALFRED L. BRODY, *Primary Examiner.*